United States Patent [19]

Naem

[11] Patent Number: 5,736,419
[45] Date of Patent: Apr. 7, 1998

[54] METHOD OF FABRICATING A RAISED SOURCE/DRAIN MOSFET USING SELF-ALIGNED POCL₃ FOR DOPING GATE/ SOURCE/DRAIN REGIONS

[75] Inventor: Abdalla Aly Naem, Sunnyvale, Calif.

[73] Assignee: National Semiconductor Corporation, Santa Clara, Calif.

[21] Appl. No.: 747,447

[22] Filed: Nov. 12, 1996

[51] Int. Cl.⁶ .................... H01L 21/265; H01L 21/44
[52] U.S. Cl. .................... 437/44; 437/195; 437/200
[58] Field of Search .................... 437/40, 41, 44, 437/45, 56, 195, 200

[56] References Cited

U.S. PATENT DOCUMENTS

| 4,668,971 | 5/1987 | Hynecek | 357/24 |
| 5,612,240 | 3/1997 | Chang | 437/44 |

OTHER PUBLICATIONS

Wolf, Stanley "Silicon Processing For The VLSI Era, vol. II—Process Integration", Lattice Press, pp. 131–134, 199–217, 1990 month unknown.

Wolf, Stanley "Silicon Processing For The VLSI Era, vol. 1—Process Technology", Lattice Press, pp. 384–390, 1986 month unknown.

C.T. Liu, et al., "MOSFET's with One–Mask Sealed Diffusion–Junctions for ULSI Applications", IEEE Electron Device Letters, vol. 16, No. 8, Aug. 1995.

T.M. Liu, et al., "An Ultra High Speed ECL–Bipolar CMOS Technology with Silicon Fillet Self–aligned Contacts", IEEE Symposium on VLSI Technology Digest of Technical Papers, pp. 30–31, 1992 month unknown.

T.M. Liu, et al., "A Half–micron Super Self–aligned BiCMOS Technology for High Speed Applications", IEEE, pp. 2.2.1–2.2.4, 1992 month unknown.

T.M. Liu, et al., "The Control of Polysilicon/Silicon Interface Processed by Rapid Thermal Anneal", IEEE, pp. 263–266, 1991 month unknown.

Tzu–Yin Chiu, et al., "Non–overlapping Super Self–Aligned BiCMOS with 87ps Low Power ECL", IEEE, pp. 752–755 date unknown.

Primary Examiner—Jey Tsai
Assistant Examiner—Michael S. Lebentritt
Attorney, Agent, or Firm—Limbach & Limbach L.L.P.

[57] ABSTRACT

A MOSFET design is provided that utilizes raised poly source/drain regions in a novel manner, thereby reducing the problems associated with conventional MOSFET designs, including the "short channel effect." The "short channel effect" is reduced by forming the N+ junction inside the N–LDD diffusion by outdiffusing from the overlying doped poly. Junctions are formed from doped poly using a POCl₃ source self-aligned to the gate, source and drain regions, and RTA to drive dopant from the poly into the silicon substrate. Since the raised poly source/drain regions extend over field oxide, the source/drain junction areas are much smaller; parasitic capacitances are greatly reduced and device speed is enhanced. The process results in low resistivity compared to conventional techniques, even without the use of salicide. Since there is no gate implantation, there is a reduced risk of damage to the gate oxide.

6 Claims, 7 Drawing Sheets

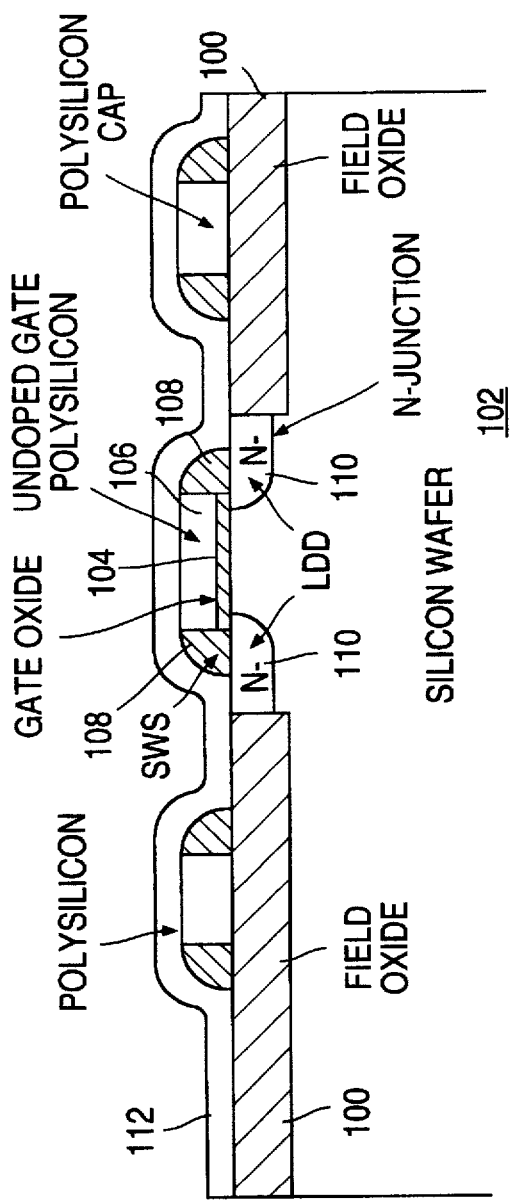
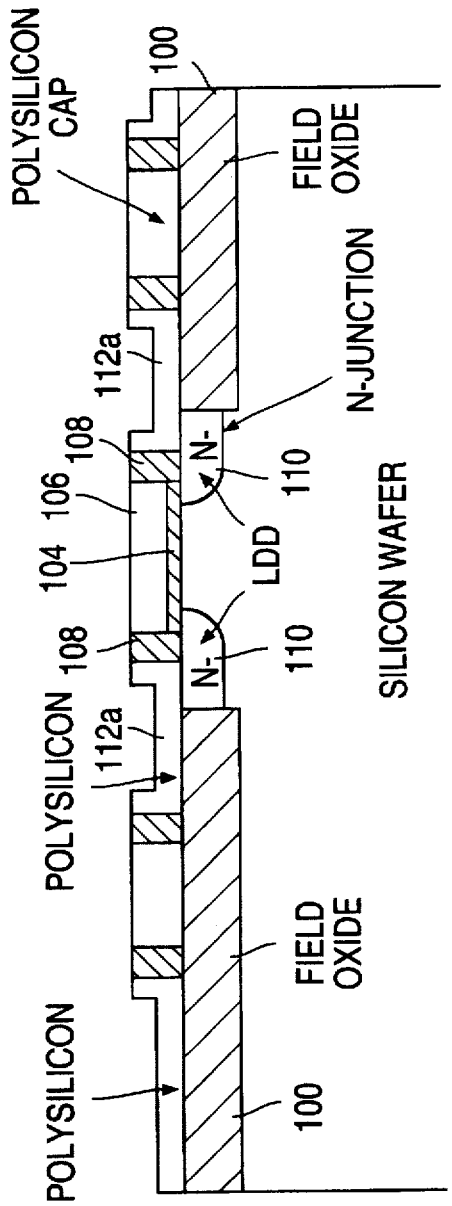
FIG. 2B
FIG. 2C

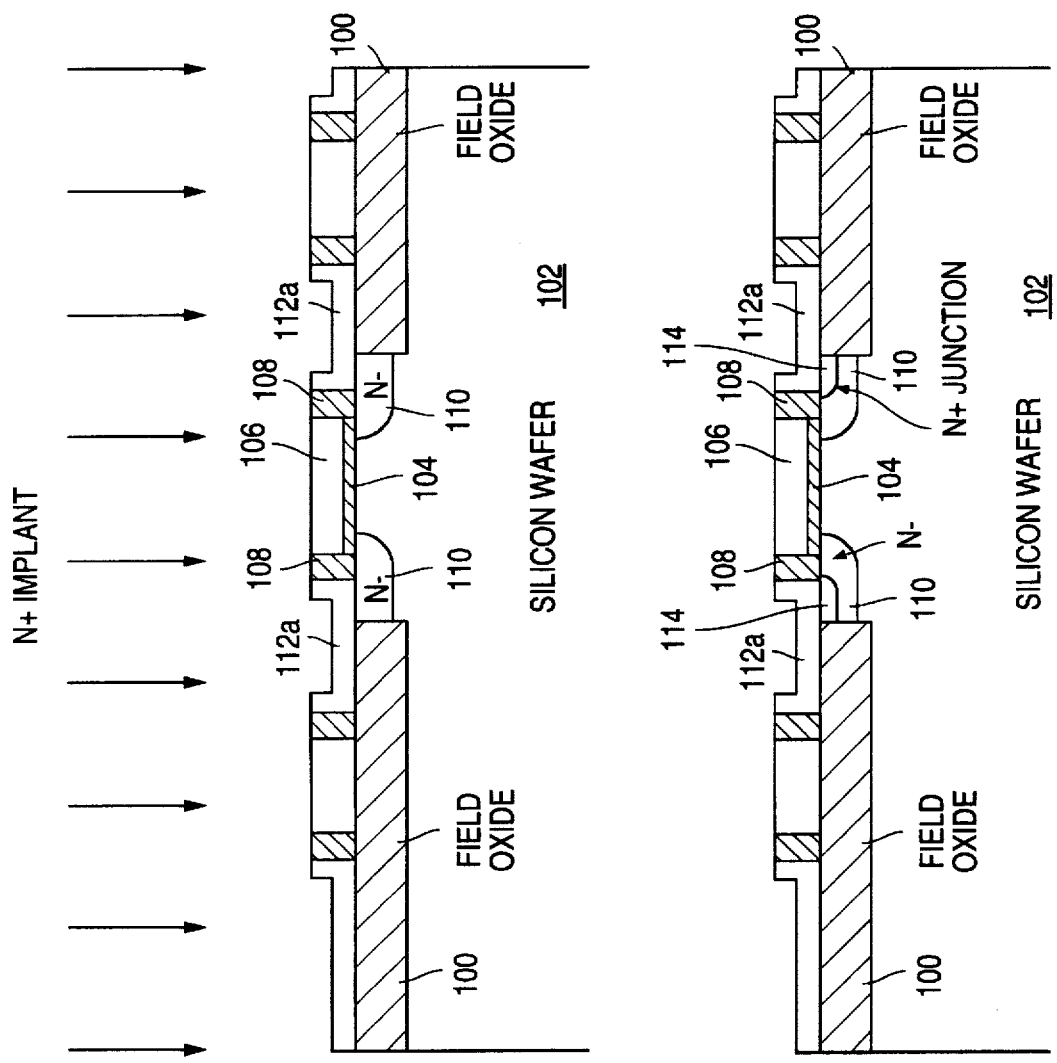

METHOD OF FABRICATING A RAISED SOURCE/DRAIN MOSFET USING SELF-ALIGNED POCL₃ FOR DOPING GATE/SOURCE/DRAIN REGIONS

BACKGROUND OF THE INVENTION

1. Field of the Invention

The present invention relates to fabrication techniques for integrated circuit elements and, in particular, to a process flow for fabricating a raised source/drain MOSFET using a phosphorous oxychloride ($POCl_3$) source that is self-aligned to the gate, source and drain regions of the device to dope these regions to a desired conductivity level.

2. Discussion of the Related Art

FIG. 1 shows a conventional MOSFET transistor 10 formed in an active device region of a semiconductor wafer substrate, the active device region being defined by field oxide in the conventional manner. In fabricating the MOSFET 10, a layer of polysilicon is formed on a layer of thin gate oxide formed on the surface of the substrate active device region. The polysilicon layer is then masked and both the exposed polysilicon and the underlying gate oxide are etched to define a polysilicon gate region 12 that is separated from the substrate by gate oxide 14. A self-aligned implant of N-type dopant then forms "lightly doped drain" (LDD) regions in the substrate as a first phase in the formation of the MOSFET source/drain regions. After the formation of oxide sidewall spacers 15 on the sidewalls of the polysilicon gate 12 and the gate oxide 14, a second N+ implant is performed to set the conductivity of the polysilicon gate region 12 to a desired level and to complete the N+ source/drain regions 16. A refractory metal, e.g., titanium, is then deposited on the exposed upper surfaces of the N+ source/drain regions 16 and the polysilicon gate region 12 and annealed, thereby causing the metal to react with the underlying N+ silicon of the source/drain regions 16 and the doped polysilicon gate 12 to form metal silicide 18 on these surfaces. A layer of dielectric material 20, typically silicon oxide, is then formed, contact openings are etched in the dielectric 20 and a metallization layer 22 is formed to provide contacts to the silicide 18 on the source/drain regions 16 and to the polysilicon gate 12, thereby completing the MOSFET structure.

The above-described MOSFET fabrication technique suffers from potential problems in the formation of the source/drain regions 16. First, the selective growth of the metal silicide 18 needed for good contacts with the metallization layer 22 requires a reaction between refractory metal and underlying silicon. Therefore, the refractory metal must be formed on the N+ source/drain regions 16, which in turn must be wide enough to accommodate the photolithographic limitations of the contact opening, resulting in a wider device. Also, since silicon is consumed in this process, the junction depth of the N+ source/drain regions 16 is difficult to control and dopant depletion can occur in these regions. Furthermore, formation of the deep, heavily-doped N+ junction can result in dopant diffusion under the gate, thereby reducing the effective channel length of the MOSFET, i.e. the so-called "short channel effect."

In the manufacture of semiconductor integrated circuits, it is common to utilize doped polysilicon to provide conductive gate structures for MOS devices. Typically, the polysilicon gate is doped to a desired conductivity level by forming an overlying layer of phosphorous oxychloride ($POCl_3$) and then annealing the $POCl_3$ layer to drive the phosphorous into the polysilicon.

Co-pending and commonly-assigned application Ser. No. 08/689,334, filed Aug. 8, 1996, by Abdalla Aly Naem, titled "Self-Aligned $POCl_3$ Process for Submicron Microelectronics Applications using Amorphized Polysilicon", discloses a novel method of introducing phosphorous into undoped gate polysilicon from $POCl_3$. In accordance with the method, an initial MOS structure is developed using conventional techniques up to the lightly doped drain implant step, with the exception, that, in this case, the gate polysilicon layer remains undoped. Dopant is then implanted into the substrate to form the source/drain regions of the MOS device and, simultaneously, to amorphize the undoped gate polysilicon, thereby breaking the grain boundaries and mixing the oxide with the silicon. An oxide layer is then formed by chemical vapor deposition (CVD) and a chemical mechanical polishing (CMP) step is performed to expose the amorphized gate polysilicon. A $POCl_3$ layer is then formed over the amorphized gate polysilicon and thermally annealed to drive phosphorous from the $POCl_3$ layer into the polysilicon. The $POCl_3$ layer is then removed without the resultant gate oxide holes and oxide pillars experienced when the conventional process flow is utilized, since removal of the grain boundaries facilitates more uniform etching of the polysilicon.

Application Ser. No. 08/689,334 is hereby incorporated by reference in its entirety to provide additional background information regarding the present invention.

Co-pending and commonly-assigned application Ser. No. 08/689,335, filed Aug. 8, 1996 by Abdalla Aly Naem, titled "$POCl_3$ Process Flow for Doping Polysilicon Without Forming Oxide Pillars or Gate Oxide Shorts", also discloses a method for doping polysilicon using $POCl_3$. In accordance with this method, an initial MOS structure is developed using conventional techniques up to the formation of an undoped gate polysilicon layer over thin gate oxide. A $POCl_3$ layer is then formed over the undoped polysilicon and thermally annealed to drive phosphorous from the $POCl_3$ layer into the polysilicon to dope the gate polysilicon to a desired conductivity level. The phosphorous-rich organic layer is then removed from the surface of the $POCl_3$ using sulfuric peroxide. The remaining $POCl_3$ layer is then removed using a DI:HF solution to expose the surface of the underlying doped polysilicon. After formation of a photoresist gate mask over the doped polysilicon layer, an ion implantation step is performed, using arsenic or other heavy ion species, to amorphize the polysilicon layer and, thus, destroy the grain boundaries by mixing the oxide at the grain boundaries with the polysilicon. This leads to uniform polysilicon etching and, therefore, disappearance of the oxide pillars problem. Removal of the phosphorous-rich organic layer from the surface of the POC1B prior to the HF deglaze step facilitates a smooth, uniform etch of the $POCl_3$ in a significantly reduced etch time, thereby eliminating the formation of holes in the underlying gate oxide.

Application Ser. No. 08/689,335 is hereby incorporated by reference in its entirety to provide additional background information regarding the present invention.

SUMMARY OF THE INVENTION

The present invention provides a MOSFET design that utilizes raised source/drain regions in a way that significantly reduces the above-described problems, including the "short channel effect." The "short channel effect" is reduced because the source/drain N+ junction is formed inside the N− LDD region by outdiffusing from overlying doped polysilicon. The poly is doped using a $POCl_3$ source, self-aligned to the gate, source and drain regions, and a rapid thermal anneal to drive phosphorous dopant from the poly into the underlying substrate. The raised poly source/drain regions extend over the field oxide, thereby allowing the source/drain junction areas to be much smaller; therefore, parasitic capacitances are greatly reduced, resulting in higher device speed. Significantly, the process results in low resistivity compared to conventional techniques, even without the use of salicide. The process is also safer for the gate oxide, since there is no gate implantation and, therefore, less chance of damage to the gate oxide.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 2A–2L are partial cross-sectional drawings illustrating a sequence of steps for using self-aligned phosphorous oxychloride ($POCl_3$) to dope MOSFET gate/source/drain regions in accordance with the concepts of the present invention.

DETAILED DESCRIPTION OF THE INVENTION

A process flow for fabricating a MOSFET device having raised source/drain regions doped from phosphorous oxychloride ($POCl_3$)/in accordance with the invention will now be described in conjunction with the partial cross-sectional drawings provided in FIGS. 2A–2L. While no specific process parameters are provided, those skilled in the art will appreciate that the concepts of the invention are applicable regardless of these parameters, which will differ depending upon the specific integrated circuit structure under manufacture. Those skilled in the art will also appreciate that, while the following discussion is directed to the fabrication of N− channel devices, the concepts of the invention apply to all MOSFET technologies.

Figure 1:
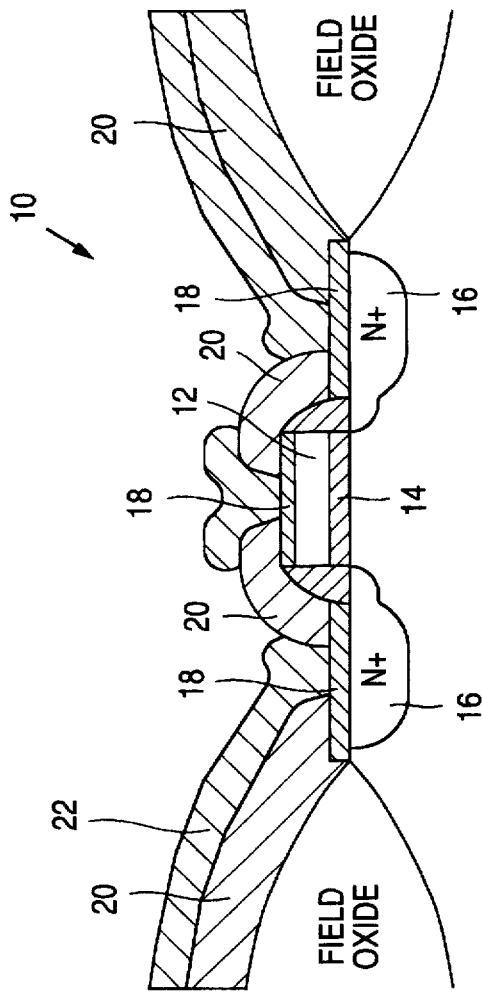
FIG. 1 is a partial cross-sectional drawing illustrating a conventional MOSFET design.
Figure 2A:
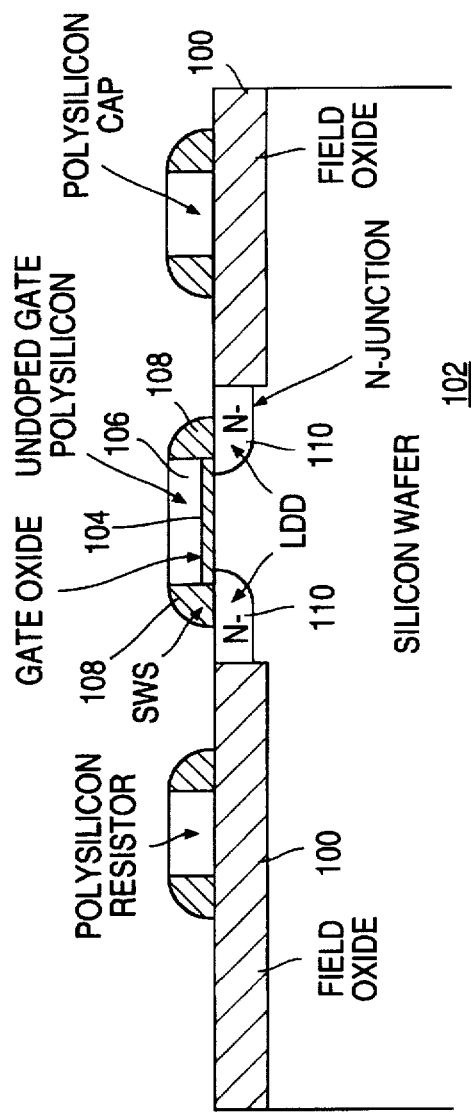

The initial fabrication sequence for a raised source/drain MOSFET configuration in accordance with the present invention proceeds in a conventional manner through the formation of the trench isolated preliminary MOSFET structure shown in FIG. 2A. As shown in FIG. 2A, conventional planarized trench isolation field oxide regions 100 are formed in a silicon wafer 102. Thin gate oxide 104 is formed on the substrate 102 to electrically insulate an undoped polysilicon gate 106 from the substrate 102. Oxide sidewall spacers (SWS) 108 are formed on the sidewalls of the polysilicon gate 106 and the gate oxide 104. "Lightly doped drain" (LDD) N− regions 110 are formed in the substrate 102 adjacent field oxide regions 100 and beneath the sidewall spacers 108 to define a MOSFET channel region in the substrate 102 beneath the undoped polysilicon gate 106.

As further shown in FIG. 2A, the first layer of polysilicon can also utilized in the formation of polysilicon capacitors and thin film resistors (TFR) on the field oxide regions 100.

Referring to FIG. 2B, a layer of polysilicon film 112 is then deposited over the FIG. 2A structure and a chemical mechanical polishing (CMP) step is performed to self-align the polysilicon raised source/drain regions 112a to the LDD N− source/drain substrate regions 110, resulting in the structure shown in FIG. 2C. As shown in FIGS. 2B and 2C, the thickness of the deposited polysilicon 112 should be sufficient to ensure that a planarized structure results after the CMP step, as shown in FIG. 2C.

As shown in FIG. 2D, a layer of phosphorous oxychloride ($POCl_3$) 113 is then formed over the FIG. 2C structure. Phosphorous is then thermally driven from the $POCl_3$ into the underlying polysilicon gate 106 and into the raised source/drain poly regions 112a to achieve a desired dopant level.

Referring to FIG. 2E, following removal of the $POCl_3$ layer 113, a rapid thermal processing (RTP) step is performed to outdiffuse the N+ dopant from the polysilicon raised source/drain regions 112a into the underlying silicon substrate to form an N+ junction 114 in the N− LDD source/drain regions 110, resulting in the structure shown in FIG. 2E. It is noted that, since the N+ junction is formed inside the LDD N− substrate regions by outdiffussing dopant from the raised poly regions 112a, the short channel effects experienced in the prior art processes are substantially reduced.

Figure 2F:
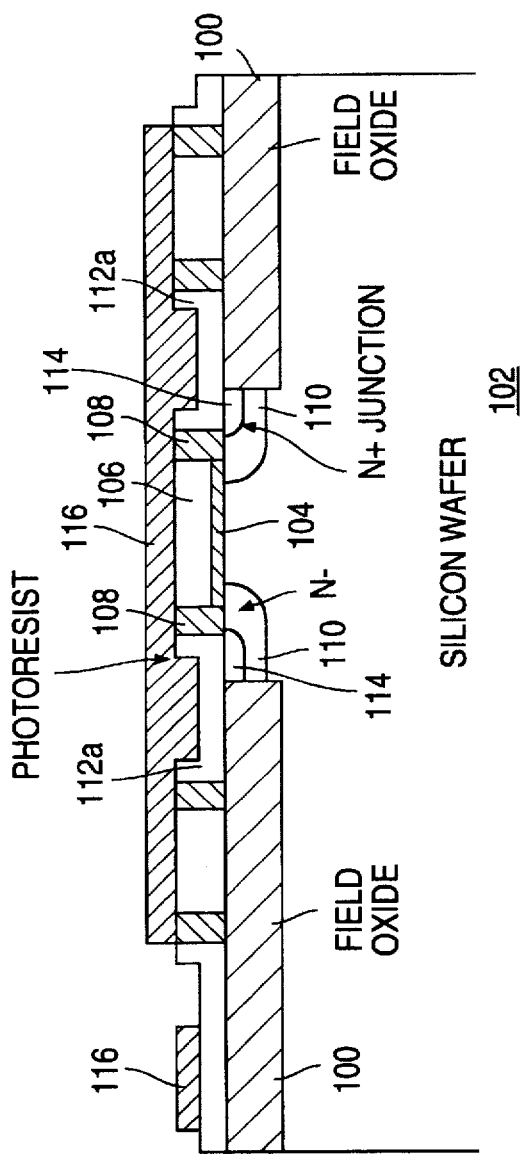

Referring to FIG. 2F, a photoresist mask 116 is then defined over the FIG. 2E structure to pattern a polysilicon thin film resistor (TFR) and, primarily, at the same time, to protect the source/drain polysilicon regions 112a. The unwanted polysilicon is then etched away and the photoresist mask 116 is removed, resulting in the structure shown in FIG. 2G.

Figure 2G:
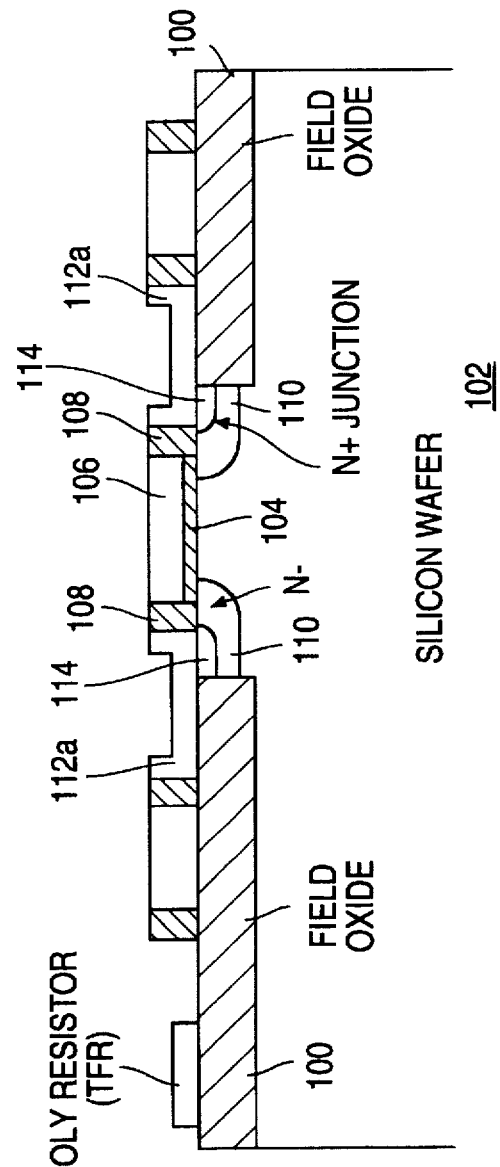
Figure 2H:
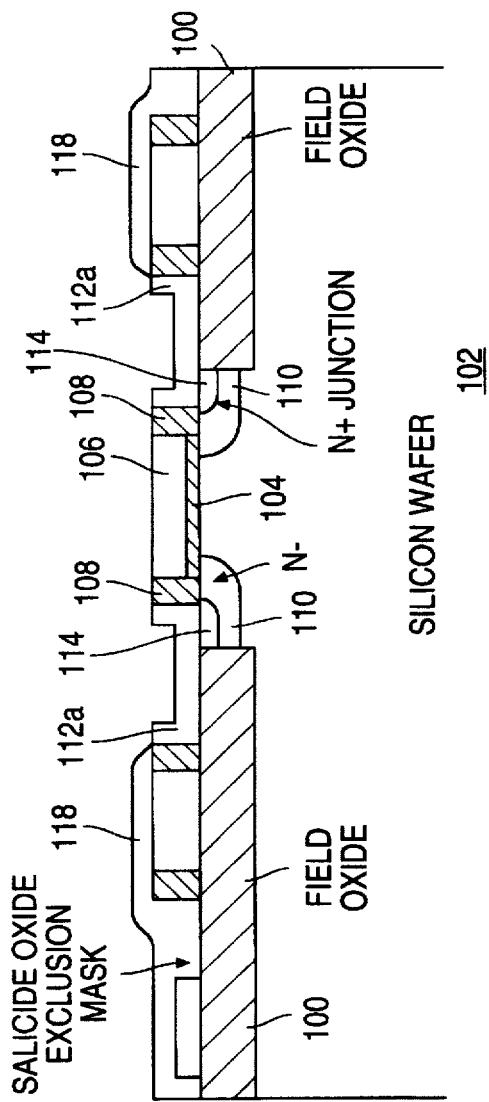

Next, a salicide oxide exclusion mask 118 is formed to protect the FIG. 2G structure with the exception of the polysilicon raised source/drain regions 112a and the doped polysilicon gate 106, as shown in FIG. 2H.

Figure 2I:
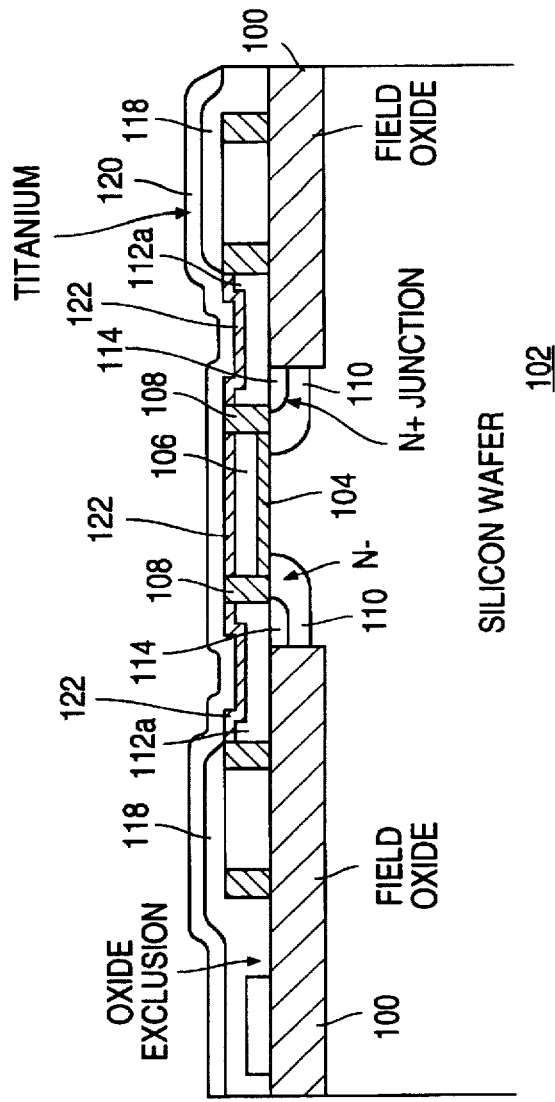
Figure 2J:
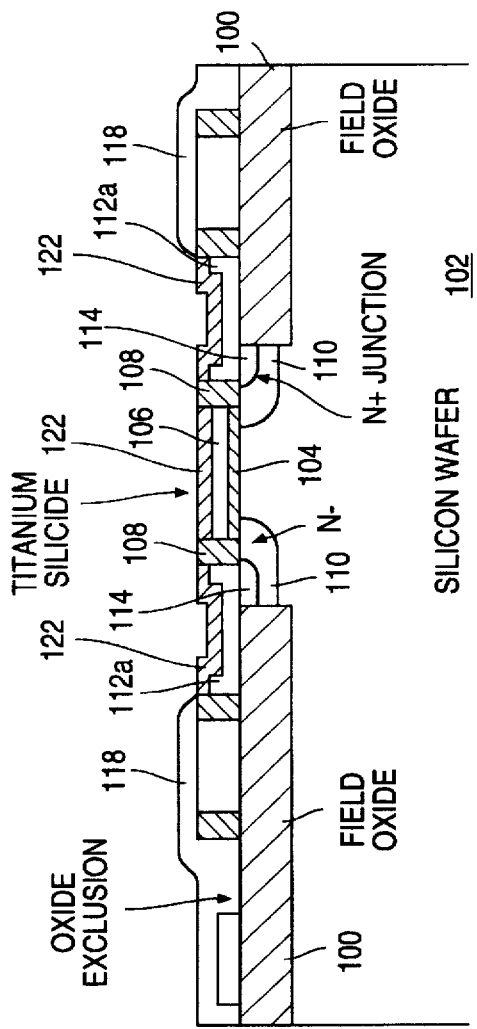

Next, as shown in FIG. 2I, a film 120 of refractory metal, e.g. titanium, is deposited over the entire FIG. 2H structure and a rapid thermal processing (RTP) step is performed to form salicide 122 on the raised source/drain polysilicon regions 112a and on the doped polysilicon gate region 106. The unreacted refractory metal 120 is then removed using a conventional wet selective etch, resulting in the structure shown in FIG. 2J.

Figure 2K:
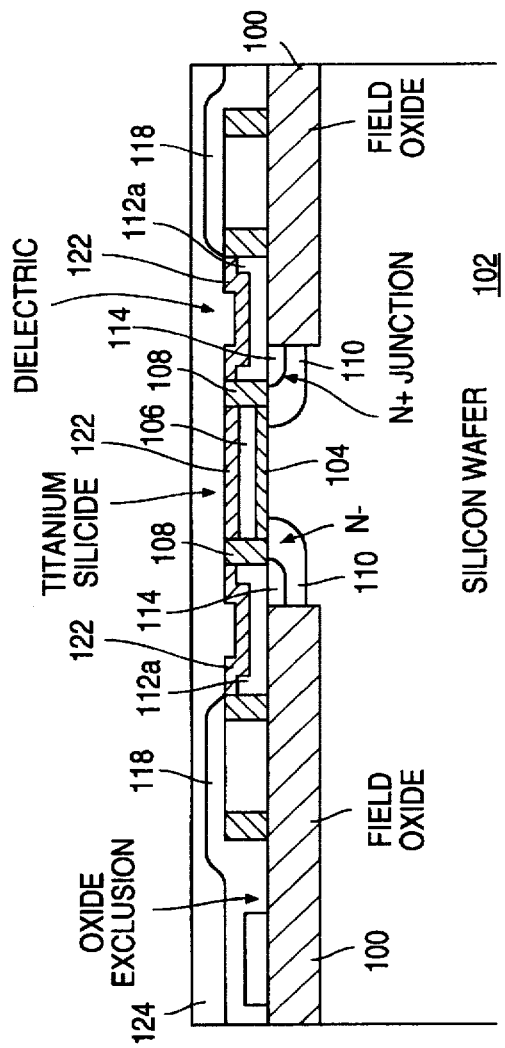

After removal of the unreacted metal 120, a dielectric layer 124, e.g. silicon oxide, is deposited and a chemical mechanical polishing (CMP) step is performed to planarize the structure, as shown in FIG. 2K.

Figure 2L:
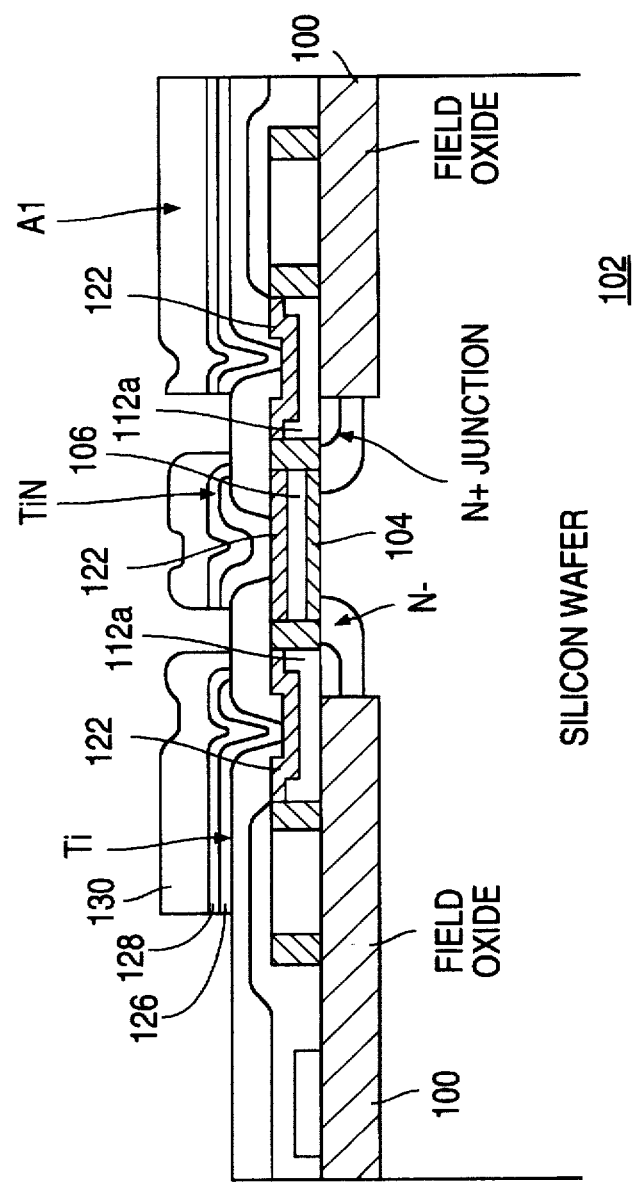

Finally, as shown in FIG. 2L, contact holes are opened in the dielectric layer 124 and a metallization structure is deposited to form contacts with the silicide 122 formed on the poly raised source/drain regions 112a and on the doped polysilicon gate 106. In the embodiment of the invention illustrated in FIG. 2L, the contact metallization includes a first layer of titanium 126, a second layer of titanium nitride 128 and a final layer of aluminum 130.

It should be understood that various alternatives to the embodiments of the invention described herein may be employed in practicing the invention. For example, those skilled in the art will appreciate that the above-described process could be carried out without the use of silicide. is intended that the following claims define the scope of the invention and that methods and structures within the scope of these claims and their equivalents be covered thereby.

What is claimed is:

1. A method of fabricating a MOSFET device structure in a silicon substrate using self-aligned source for doping the gate, source and drain regions of the structure, the silicon substrate having a first conductivity type, the fabrication method comprising:

formed spaced-apart field oxide isolation regions in the substrate to define an active device substrate region therebetween;

forming a polysilicon gate over the active device substrate region and separated from the active device substrate region by an underlying layer of gate oxide;

forming first and second spaced-apart lightly doped regions having a second conductivity type opposite the first conductivity type in the active device substrate region to define a substrate channel region therebetween such that the polysilicon gate is formed over the substrate channel region;

forming oxide sidewall spacers on sidewalls of the polysilicon gate and gate oxide;

forming a layer of polysilicon over the structure resulting from the above-recited steps;

performing a chemical mechanical polishing (CMP) step to substantially planarize an upper surface of the structure resulting from the step of forming a layer of polysilicon to define a polysilicon gate region and first and second raised polysilicon regions formed over the first and second lightly doped regions, respectively, and formed partially over adjacent field oxide;

forming a layer of a dopant source that includes dopant of the second conductivity type on the substantially planarized upper surface;

thermally driving dopant from the dopant source layer into the underlying polysilicon gate region and first and second raised polysilicon regions;

performing a rapid thermal anneal step to outdiffuse dopant from the first and second raised polysilicon regions into the underlying first and second lightly doped regions, respectively; and removing the dopant source layer.

2. A method as in claim 1 and comprising the further steps of:

forming a layer of refractory metal on the polysilicon gate region and on the first and second raised polysilicon regions;

performing a rapid thermal processing step to form refractory metal silicide on the polysilicon gate region and on the first and second raised polysilicon regions by reacting the refractory metal with underlying polysilicon;

removing unreacted refractory metal;

forming dielectric material over the refractory metal silicide;

forming contact openings through the dielectric material to expose an upper surface of the refractory metal silicide formed on the first and second raised polysilicon regions; and forming conductive material in the contact openings.

3. A method of fabricating a raised source/drain MOSFET device structure in a silicon substrate using self-aligned $POCl_3$ for doping the gate, source and drain regions of the structure, the fabrication method comprising:

formed spaced-apart field oxide isolation regions in the substrate to define an active device substrate region therebetween;

forming a polysilicon gate over the active device substrate region and separated from the active device substrate region by an underlying layer of gate oxide;

forming first and second spaced-apart lightly doped regions in the active device substrate region to define a substrate channel region therebetween such that the polysilicon gate is formed over the substrate channel region;

forming oxide sidewall spacers on sidewalls of the polysilicon gate and gate oxide;

forming a layer of polysilicon over the structure resulting from the above-recited steps;

performing a chemical mechanical polishing (CMP) step to substantially planarize an upper surface of the structure resulting from the step of forming a layer of polysilicon to define a polysilicon gate region and first and second raised polysilicon regions formed over the first and second lightly doped regions, respectively, and formed partially over adjacent field oxide;

forming a layer of phosphorous oxychloride ($POCl_3$) on the substantially planarized upper surface;

thermally driving phosphorous from the $POCl_3$ layer into the underlying polysilicon gate region and first and second raised polysilicon regions;

performing a rapid thermal anneal step to outdiffuse phosphorous from the first and second raised polysilicon regions into the underlying first and second lightly doped regions, respectively; and removing the $POCl_3$ layer.

4. A method as in claim 3 and comprising the further steps of:

forming a layer of refractory metal on the polysilicon gate region and on the first and second raised polysilicon regions;

performing a rapid thermal processing step to form refractory metal silicide on the polysilicon gate region and on the first and second raised polysilicon regions by reacting the refractory metal with underlying polysilicon;

removing unreacted refractory metal;

forming dielectric material over the refractory metal silicide;

forming contact openings through the dielectric material to expose an upper surface of the refractory metal silicide formed on the first and second raised polysilicon regions; and forming conductive material in the contact openings.

5. A method as in claim 4 and wherein the refractory metal is titanium.

6. A method as in claim 5 and wherein the conductive material comprises a layer of titanium, a layer of titanium nitride formed on the titanium layer and a layer of aluminum formed on the titanium nitride layer.

* * * * *